(12) United States Patent
Srouji et al.

(10) Patent No.: US 7,346,864 B2
(45) Date of Patent: Mar. 18, 2008

(54) LOGIC DESIGN DEVELOPMENT TOOL AND METHOD

(75) Inventors: Johny Srouji, Haifa (IL); Habeeb Farah, Nazareth (IL); Yulik Feldman, Netanya (IL); Gila Kamhi, Zichron Yaakov (IL); Jacob Katz, Netanya (IL); Yossef Levy, Hoshaya (IL)

(73) Assignee: Intel Corporation, Santa Clara, CA (US)

( * ) Notice: Subject to any disclaimer, the term of this patent is extended or adjusted under 35 U.S.C. 154(b) by 109 days.

(21) Appl. No.: 11/094,809

(22) Filed: Mar. 31, 2005

(65) Prior Publication Data

US 2006/0229859 A1 Oct. 12, 2006

(51) Int. Cl.
*G06F 17/50* (2006.01)

(52) U.S. Cl. .................. 716/3; 716/1; 716/2; 716/7; 716/18

(58) Field of Classification Search ................ 716/1–3, 716/18, 7; 703/13–22
See application file for complete search history.

(56) References Cited

U.S. PATENT DOCUMENTS

| | | | | |
|---|---|---|---|---|
| 5,848,263 A | * | 12/1998 | Oshikiri | 716/3 |
| 5,995,763 A | * | 11/1999 | Posa et al. | 396/57 |
| 6,263,483 B1 | * | 7/2001 | Dupenloup | 716/18 |
| 7,194,400 B2 | * | 3/2007 | Gabele et al. | 703/21 |
| 2004/0117167 A1 | * | 6/2004 | Neifert et al. | 703/14 |
| 2004/0117168 A1 | * | 6/2004 | Neifert et al. | 703/14 |
| 2004/0250231 A1 | * | 12/2004 | Killian et al. | 716/18 |
| 2005/0246668 A1 | * | 11/2005 | Gunther et al. | 716/3 |

OTHER PUBLICATIONS

Printouts for Synopsys located at http://synopsys.com and www.synopsys.com/products.
Printout for Calypto Design Systems located at http://www.calypto.com.
Printout for Interra Systems located at http://www.interrasystems.com.
Printout for Verific Design Automation located at http://www.verific.com.

* cited by examiner

*Primary Examiner*—Jack Chiang
*Assistant Examiner*—Nghia M. Doan
(74) *Attorney, Agent, or Firm*—Ked & Assocaites, LLP (57) ABSTRACT

A logic design development tool including a converting unit configured to convert a plurality of different circuit design languages into a common intermediate format, and an executing unit configured to execute the common intermediate format so as to perform a design simulation of a circuit defined by the circuit design languages.

19 Claims, 5 Drawing Sheets

LOGIC DESIGN DEVELOPMENT TOOL AND METHOD

FIELD

An embodiment of the present invention relates to a logic design development tool.

BACKGROUND

Currently, circuits are designed using a specific Registered Transfer Level (RTL) language such as VERILOG, SYSTEM VERILOG, VHDL, etc. (Trademarks). Other proprietary RTL languages are also used such as iHDL (Trademarks), Merlin (produced by Intel, the assignee of the present application) or high level modeling languages such as System-C (Trademarks). Thus, using the specific RTL language, a design engineer is able to design, test and verify a Very Large Scale Integrated (VLSI) circuit prior to manufacturing the circuit.

Further, each specific RTL language includes a corresponding simulator allowing the design engineer to simulate a performance of the designed circuit. Accordingly, when a designed logic includes elements produced by different RTL languages (such as one component designed using Verilog and another component using iHDL), a co-simulator is created to handle communications between the different simulators. However, developing a co-simulator may burden the design process.

BRIEF DESCRIPTION OF THE DRAWINGS

Embodiments of the invention will be described in detail with reference to the following drawings in which like reference numerals refer to like elements wherein.

DETAILED DESCRIPTION

Figure 1:
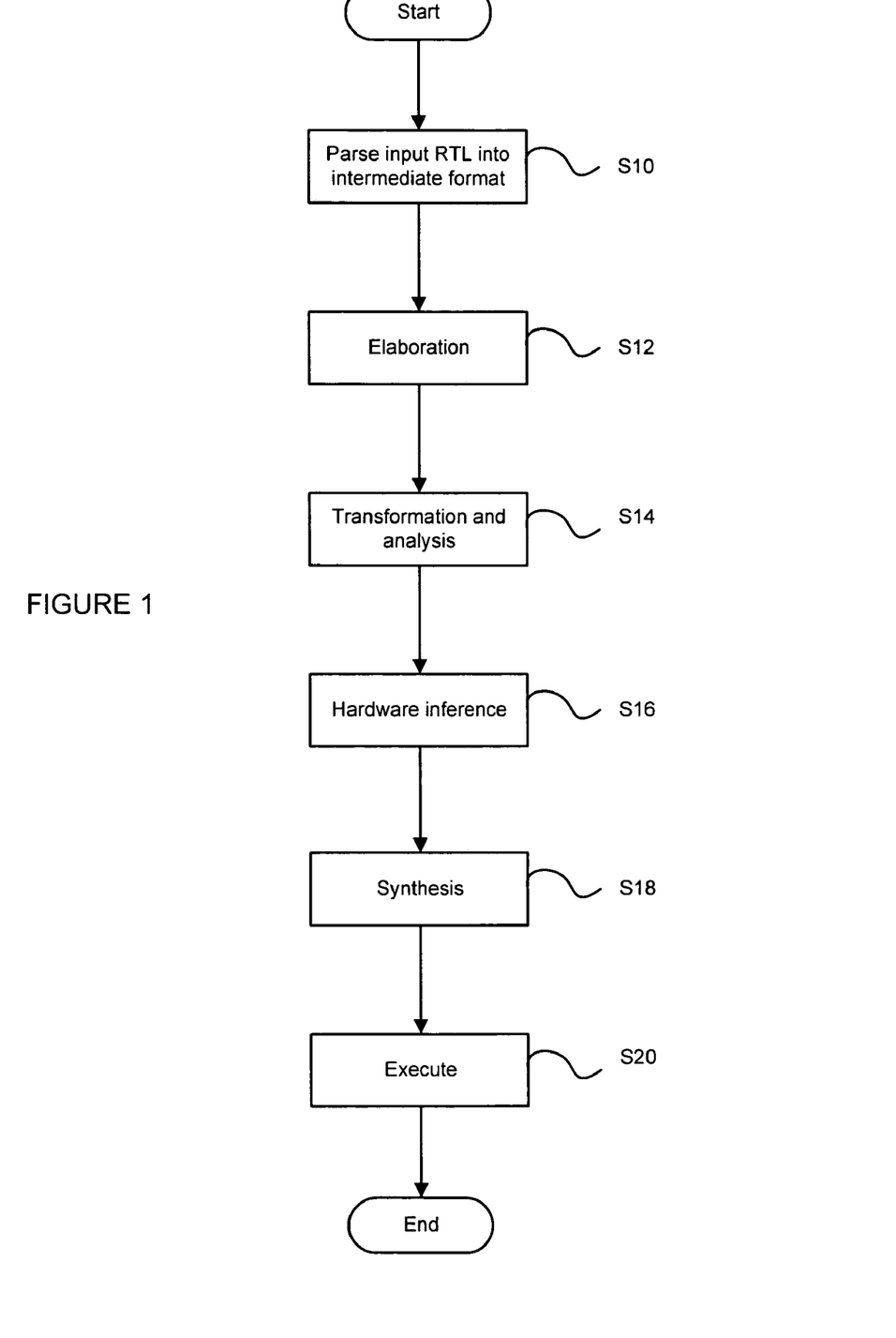
FIG. 1 is a flowchart illustrating a design process according to an example embodiment of the present invention.

FIG. 1 is a flowchart illustrating a method for processing RTL languages according to an example embodiment of the present invention. As shown, the method first parses the input RTL languages into an intermediate format (block S10). In more detail, as noted above, there are several different types of RTL languages.

For example, assume a comparator written in Verilog and a comparator written in iHDL are used in a design process. In this instance, the two different RTL languages are processed according to the blocks shown in FIG. 1, for example. A detailed example of these processes will now be described. The Verilog RTL language is as follows:

Verilog (input):

```
module comparator (result, A, B, greaterNotLess, reset);
parameter width = 8;
input [width-1:0] A, B;
input reset;
input greaterNotLess;
```

-continued

```
output [width:0] result;
always @(A, B, greaterNotLess, reset)
begin
    if (reset)
        begin
            result = '0;
        end
    else
        begin
            if (greaterNotLess)
                begin
                    result[0] = (A > B);
                    result[width:1] = result[0] ? A : B;
                end
            else
                begin
                    result[0] = (A < B);
                    result[width:1] = result[0] ? B : A;
                end
        end
end
endmodule
```

The iHDL RTL language is as follows:

iHDL (Input):

```
fub comparator;
begin "comparator"
GENERIC (integer width=(8))
interface (
output node result [width:0];
input node A [width-1:0];
input node B [width-1:0];
input node greaterNotLess;
input node reset);
structural main;
begin "main"
    if (reset) then
        begin
            result := $cvn(0);
        end
    else
        begin
            if (greaterNotLess) then
                begin
                    result[0] := (A > B);
                    result[width:1] := if (result[0]) then A else B;
                end
            else
                begin
                    result[0] := (A < B);
                    result[width:1] := if (result[0]) then B else A;
                end
        end
end "main" ;
end "comparator";
```

The RTL language similarities in this example include, for example, the beginning and ending definitions of the module, the parameter(s) used to define the module, the input(s) and output(s) of the module, and the assigned delay value. In this example, the inputs and output values are parsed into an intermediate format.

In addition, note that prior to parsing of RTL languages into an intermediate format, the respective iHDL and Verilog code, for example, is preprocessed using iHDL and Verilog preprocessors, respectively. The preprocessors process the macro and include statements to generate a macro free RTL.

As shown in FIG. 1, the input RTL language is also elaborated according to an example embodiment of the present invention (block S12). In the elaboration process, the RTL source code is searched to determine if any defined variables can be converted into constant values, for example. For example, in the above-noted Verilog comparator example, one input value is defined as "input [width-1:0] A, B." Further, the parameter "width" is defined as equal to 8 (bits). Thus, the input value may be elaborated as "input [8-1:0] A, B" or "input [7:0] A, B." Further, each signal is split into an atomic part that has a simple driving expression that combines all drivers of this atomic part of the signal. The below example illustrates these features.

Verilog Model (Elaborated):

```
module comparator( output wire [8:0] result,
    input wire [7:0] a,
    input wire [7:0] b,
    input wire greaternotless,
    input wire reset );
assign result[0] = reset ? 1'b0 : greaterNotLess ? (A > B) : (A < B);
assign result[8:1] = reset ? 8'b00000000 : greaterNotLess ?
(A > B) ? A : B : (A < B) ?
B : A;
endmodule
```

Transformation and analysis is then performed on the elaborated intermediate format (block S14). Transformation and analysis include, for example, constant propagation and dead code elimination. The following is a simple example of constant propagation. Assume the variables A and B are defined as follows:

$$A=3C$$

$$B=2+A$$

Also assume that the value C is previously assigned a value of 5, and thus using the elaboration process, the value A is defined as a constant equal to 15. Therefore, in the constant propagation process, the variable B can be defined as the constant B=17 (i.e., 2+15). That is, the constant values determined in the elaboration process are propagated throughout the RTL language. The constant propagation process is also recursive. Thus, the constant B=17 is used to further define other variables.

Dead code elimination is then performed on the resulting intermediate format. In dead code elimination, the resulting code is searched to identify pieces of the resulting intermediate format that are not executed (e.g., an 'if' condition that was evaluated to be false). The transformation and analysis process is advantageous because the size of the final executable can be reduced. This is particularly advantageous in chip design because sometimes the RTL is more generic to suit different usages of a particular module. Transformation and analysis also includes, for example, concurrentization. In concurrentization, the sequential dependency of the code is removed such that the system can be executed in parallel.

Hardware inference is then performed (block S16). Generally, there are two types of elements: combinational and sequential. Sequential elements include, for example, latches and flip-flops, i.e., elements that store data. Sequential elements are sometimes called memory elements. Other elements (combinational elements) are operational. Combinational elements include, for example, wires, multipliers, AND gates, OR gates, etc. Thus, in this block, the processed languages are searched and the combinational and sequential elements are identified.

The resulting expression can then be synthesized (block S18) to produce a Netlist representing the final logic of an electronic circuit. The Netlist can then be executed to perform a design simulation of a circuit defined by the different circuit design languages that were converted into an intermediate format according to the present embodiment (block S20). Further, the above example illustrates the RTL languages Verilog and iHDL. However, the present embodiment can also process other RTL commonly known languages, proprietary RTL languages or yet unknown RTL languages. This is accomplished by preparing a parser computer program, for example, that parses the RTL language into the common intermediate format. In addition, the above synthesized code was created using a Verilog Netlist while other output formats may also be used.

Thus, according to an example embodiment of the present invention, the different RTL languages (e.g., iHDL, Verilog, System Verilog, VHDL, System-C, Merlin, etc.) are transformed into one common internal representation format. This enables design, verification, synthesis and test applications to use the transformed common internal representation format to access information or manipulate RTL models implemented in multiple languages.

Figure 2:
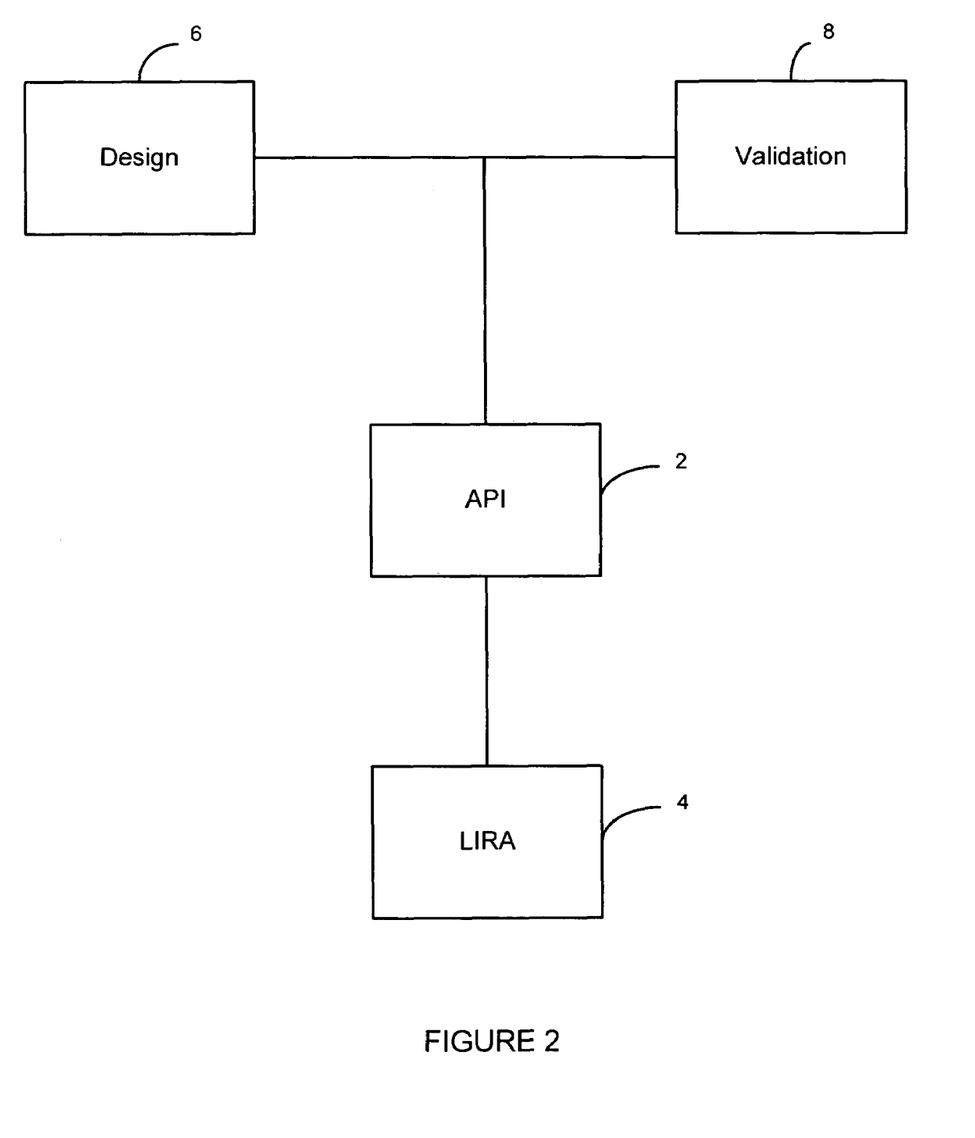
FIG. 2 is a block diagram illustrating an Application Program Interface (API) according to an example embodiment of the present invention.

An example embodiment of the present invention also provides a novel Application Program Interface (API). As shown in FIG. 2, the API 2 interfaces with the processes discussed above with respect to FIG. 1 for producing a Language Independent RTL Architecture (LIRA) model 4. According to the present example embodiment, the API 2 is configured to enable a user to examine the different processes used to produce the LIRA model. That is, the user is able to access the logical contents of the design as well as the structural and behavioral information at substantially any level of abstraction. For example, the user may access the parsed RTL, the elaborated code, etc. Thus, the user can advantageously view each stage performed in producing the synthesized data model. The user is also able to modify/add/create instances in each stage. Therefore, the user is able to tweak the design at each process. For example, in designing the logic of a circuit, a user may halt the processes shown in FIG. 1 at the transformation stage (block S14 in FIG. 1), and then modify/add/create/delete instances at that stage. For example, a user may query the design and decide to add additional logic to ensure a better manufacturing quality, etc.

Thus, with the API 2 according to an example embodiment of the present invention, the user or design engineer can access and manipulate data at several abstraction levels, such as just-parsed source code, elaborated code, code after constant propagation, code after dead code elimination, control- and data-flow graphs of the code, code after hardware modeling, etc.

The API 2 may also be used to better adjust the code before the code is synthesized by external tools, or generic tools configured to manipulate the Verilog code, a memory link to formal property verification flows, a memory link to formal equivalence verification flows, integration of HDL viewing capabilities for both debugging frameworks and design tools user interface, and general inspection of HDL code via a supplied Practical Extraction and Reporting Language (PERL), for example. This enables users to ingrate LIRA capabilities according to their own specific needs. For example, FIG. 2 illustrates external design and validation tools 6, 8 operating through the API 2 such that the design engineer is able to further design and validate the existing circuit.

Figure 3:
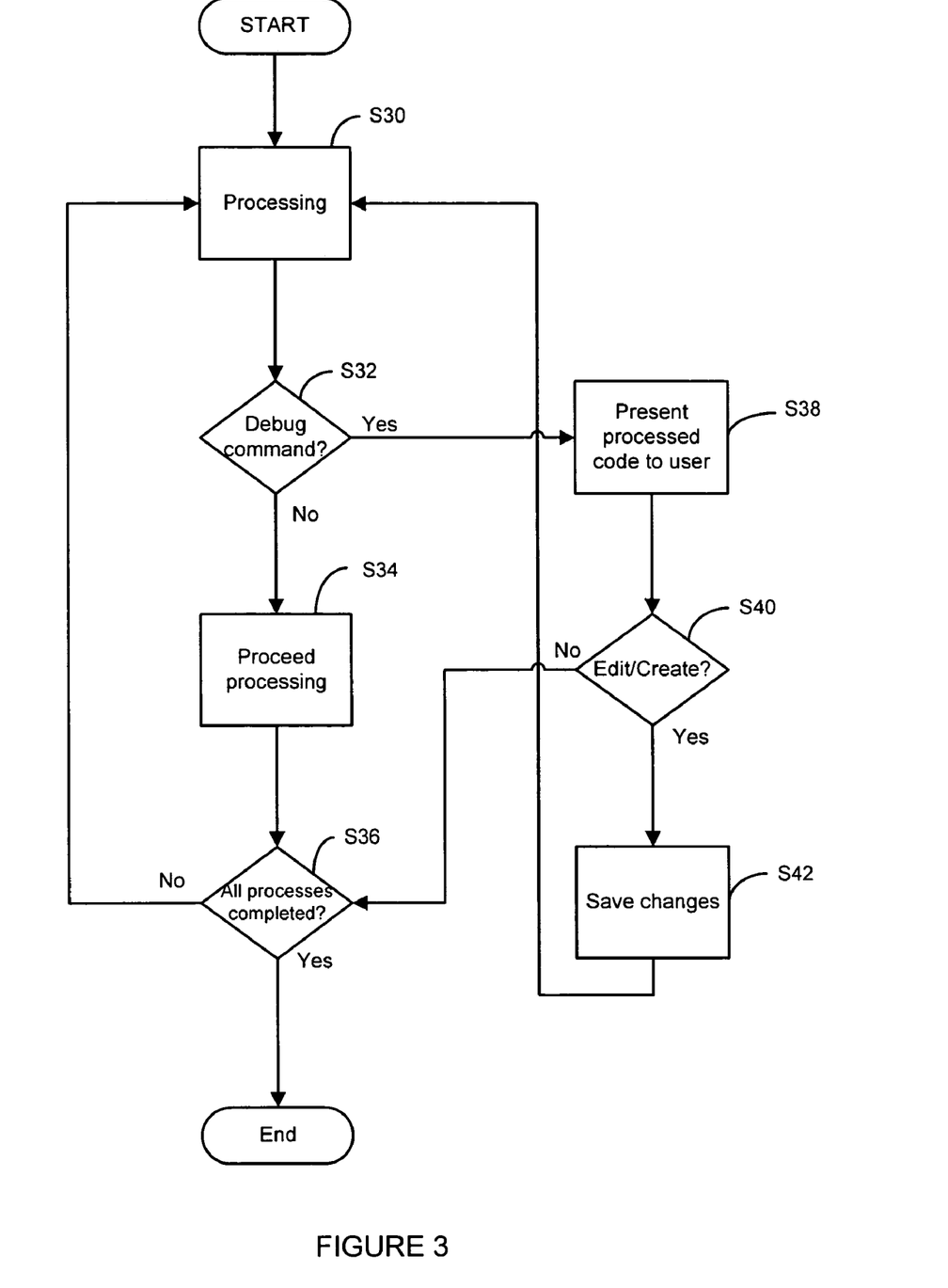
FIG. 3 is a flowchart illustrating an example operation of the API.

Next, FIG. 3 is a flowchart illustrating functions of the API according to an example embodiment of the present invention. As discussed above, a design engineer may use the API to begin execution of the stages shown in FIG. 1, and may halt or debug the process at any time during the execution.

In more detail, the user may start the design process (block S30), which begins the processes shown in FIG. 1. Further, a loop routine is operating to determine if the user has entered any edit, create, etc. commands (block S32). If no commands are entered (No in block S32), the processes shown in FIG. 1 are successively performed (block S34). If all the processes are completed (Yes in block S36), the API enters an idle state. Otherwise, the process continues (No in block S36).

Further, if the user enters a command (Yes in block S32), the thus processed code is presented to the user on a display, for example. Therefore, the user is able to add/edit/change/ etc. the design process substantially in real-time (block S40). If the user changes, edits, etc. the design (Yes in block S40), the changes are saved (block S42), and the process is resumed using the saved changes (block S30). On the other hand, if the user decides not to make any changes after viewing the presented code (No in block S40), the process returns to block S36.

Figure 4:
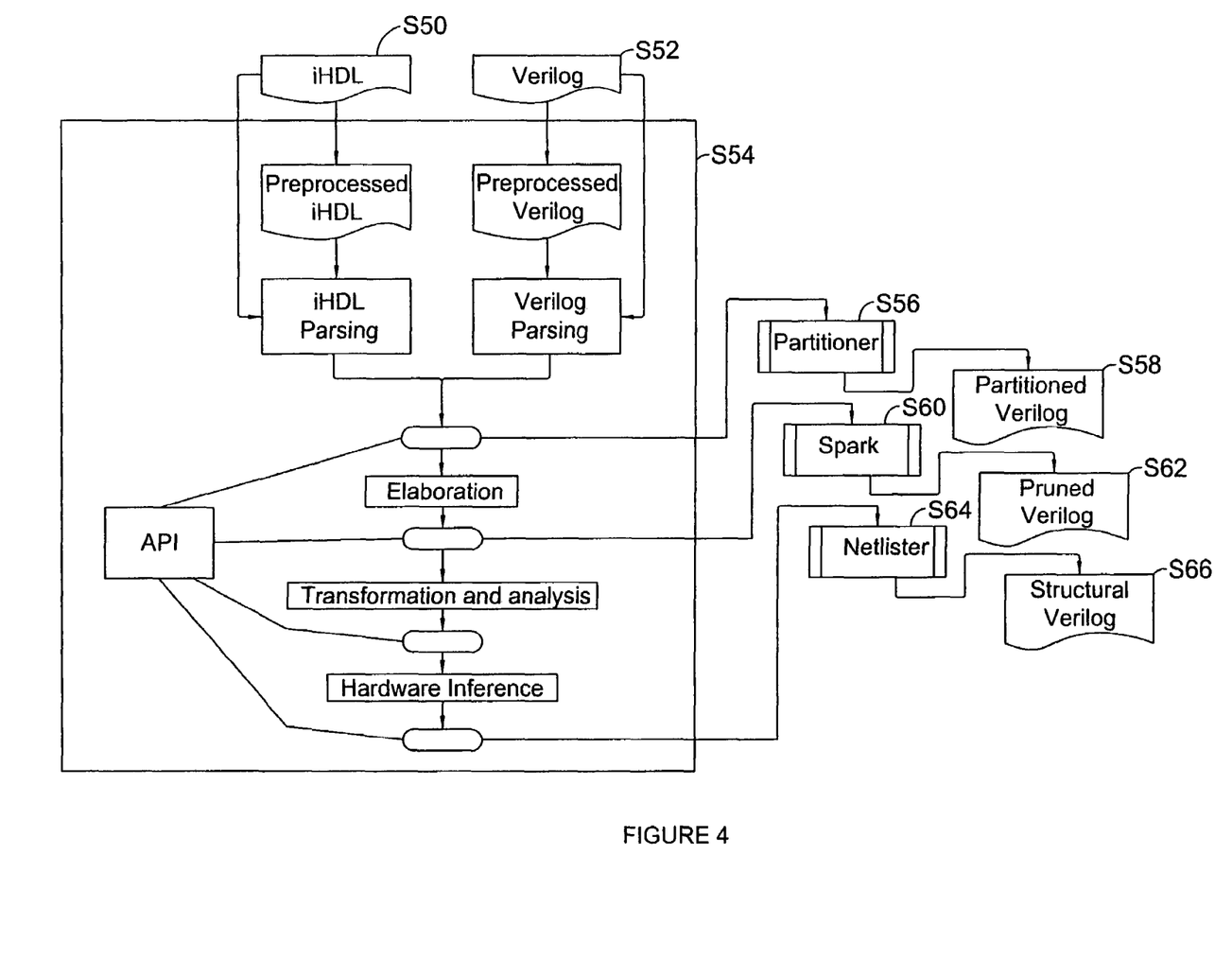
FIG. 4 is a flowchart illustrating different applications that utilize a variety of transformation stages of the API.

Next, FIG. 4 illustrates different applications that use a variety of transformation stages of the API. In more detail, blocks S50, S52 and S54 illustrate the features shown in FIGS. 1 and 2, in which iHDL and Verilog source code, for example, are processed and the API allows a user to access the different transformation stages. In addition, as shown in FIG. 4, RTL applications such as PARTITIONER, SPARK, NETLISTER™ can be written on top of the LIRA API and can share a common set of command line switches, which control the way a design is parsed and processed. In more detail, FIG. 4 illustrates a Partitioner application interfacing with the API to produce a new module base on some of the original module statements (blocks S56 and S58), a Spark application interfacing with the API to produce pruned code where only code relevant to some selected output is maintained (blocks S60 and S62), and a Netlister application interfacing with the API to produce structural netlist code for the needs of specific downstream tools (blocks S64 and S66).

Figure 5:
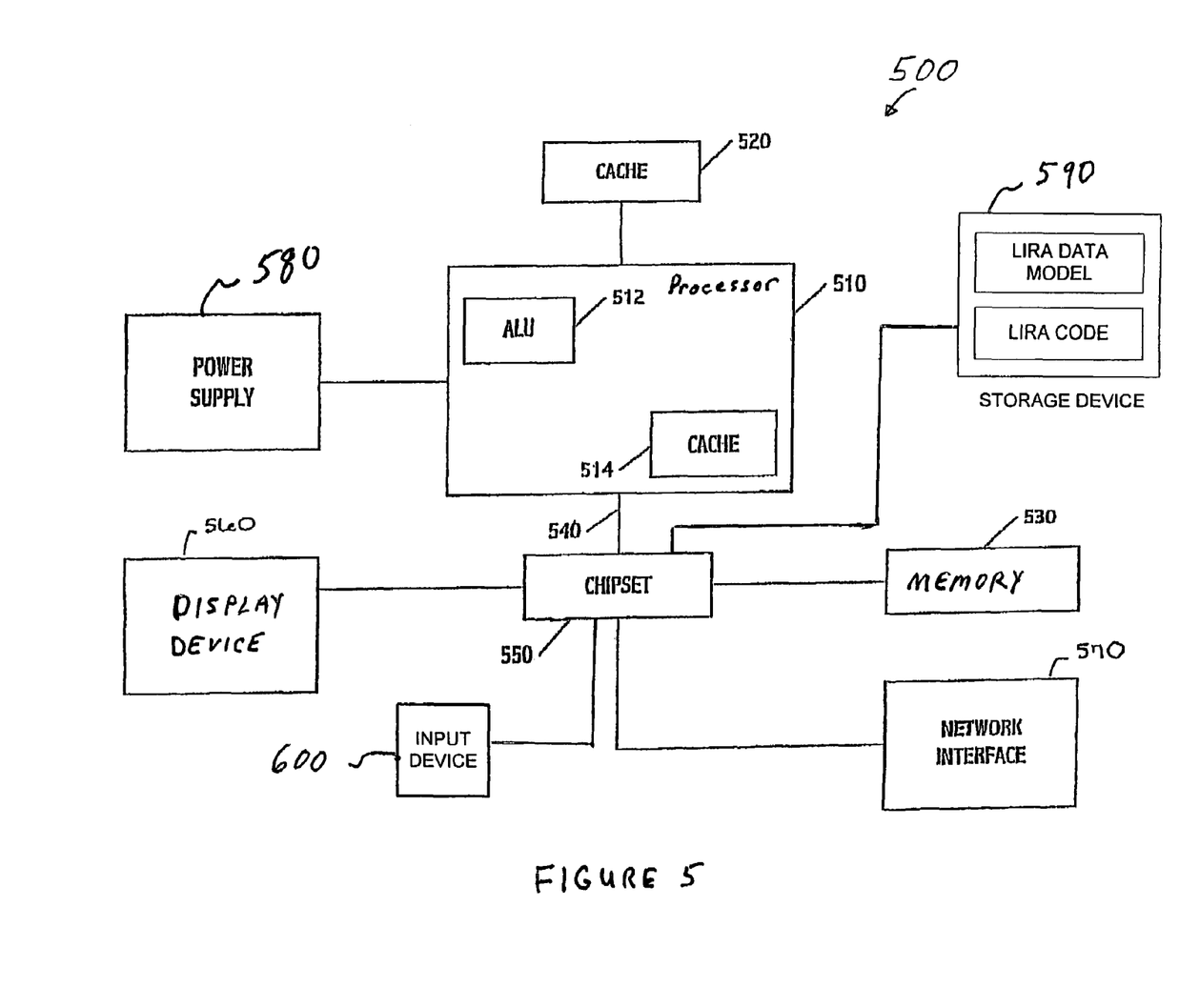
FIG. 5 is a block diagram of a system that includes an example embodiment of the present invention.

Embodiments of the present invention (or portions of embodiments) may be implemented in software for execution by a suitable data processing system configured with a suitable combination of hardware devices. FIG. 5 is a block diagram of a representative data system, namely a computer system 500, in which example embodiments of the present invention may be used. Other example embodiments and configurations are also within the scope of the present invention. More specifically, the computer system 500 may include a processor 510 that may have many sub-blocks such as an arithmetic logic unit (ALU) 512 and an on-die (or internal) cache 514. The processor 510 may also communicate to other levels of cache, such as off-die cache 520. Higher memory hierarchy levels such as a memory 530, which may comprise Random Access Memory (RAM), for example, may be accessed via a host bus 540 and a chip set 550. The system memory 530 may also be accessed in other ways, such as directly from the processor 510 and/or without passing through the host bus 540 and/or the chip set 550. In addition, other off-die functional units such as display device 560, which displays a graphical interface, for example, and a network interface 570, to name just a few, may communicate with the processor 510 via appropriate busses or ports. The system may also include a wireless interface to interface the system 500 with other systems, networks, and/or devices via a wireless connection. A power supply 580 for providing power to the system 500 is also illustrated.

Further, as shown, the system 500 also includes a storage device 590 and input device 600. The storage device 590 can include, but is not limited to, any type of disk including floppy disks, optical discs, CD-ROMs, and magneto-optical disks, ROMs, RAMs, EPROMs, EEPROMs, magnetic or optical cards, or any type of media suitable for storing electronic instructions. Further, as shown, the storage device 590 may store the LIRA code used to process the different RTL languages and may store the processed LIRA data model. The LIRA code may be downloaded from the Internet, for example, or may be transferred from any other type of medium such as CD, DVD, floppy disks, etc. Wireless communication may also be used to copy the LIRA code to the storage device 590. The storage device 590 may also operate together with the memory 530 in which information stored in the storage device 590 may be transferred to the memory 530 and vice versa. The various techniques discussed above may be performed by the system 500.

Accordingly, LIRA is a novel technology having at least the following advantages.

LIRA provides a multi-lingual design entry and can handle several languages such as iHDL, Verilog and System Verilog. Further, LIRA produces a common Intermediate format that is shared for different RTL languages and therefore enables LIRA based applications to work on different languages (e.g., and avoid the need for cross simulation). LIRA architecture is also extendible for handling new RTL or other design modeling languages such as Merlin, VHDL and System-C. Further, LIRA provides an extensive API query access (read) and modification (create) and enables access and analysis of the design at hand at multiple levels of abstractions. In addition, a LIRA common infrastructure enables different RTL applications in the domain of RTL Design, Verification, Testability and Synthesis applications. Also, LIRA produces novel techniques and novel applications of existing techniques to transform RTL designs from one abstraction level to another (converting sequential code to parallel, program slicing, etc.). Further, LIRA allows a design engineer to prune or modify a design before synthesizing it. For example, a "what if" analysis on a size of the circuit or other characteristics of the circuit may be advantageously performed.

Furthermore, having a unified representation to different design languages opens a new domain of interchanging technologies between design projects that use different RTL languages. From an early stage in the flow, LIRA is converting all languages to common internal representation, and by that allows all applications to be language independent, for example.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Further, certain method procedures may have been delineated as separate procedures; however, these separately delineated procedures should not be construed as necessary order dependent in their performance. That is, some procedures may be able to be performed in an alternative ordering, simultaneously, etc.

The foregoing embodiments and advantages are merely exemplary and are not to be construed as limiting the present invention. The present teaching can be readily applied to other types of apparatuses. The description of embodiments of the present invention is intended to be illustrative, and not to limit the scope of the claims. Many alternatives, modifications, and variations will be apparent to those skilled in the art.

This invention may be conveniently implemented using a conventional general purpose digital computer or microprocessor programmed according to the teachings of the present specification, as well be apparent to those skilled in the computer art. Appropriate software coding can readily be prepared by skilled programmers based on the teachings of the present disclosure, as will be apparent to those skilled in the software are. The invention may also be implemented by the preparation of application specific integrated circuits or by interconnecting an appropriate network of conventional component circuits, as will be readily apparent to those skilled in the art.

The present invention includes a computer program product which is a storage medium including instructions which can be used to program a computer to perform a process of the invention. The storage medium can include, but is not limited to, any type of disk including floppy disks, optical discs, CD-ROMs, and magneto-optical disks, ROMs, RAMs, EPROMs, EEPROMs, magnetic or optical cards, or any type of media suitable for storing electronic instructions.

What is claimed is:

1. A logic design development tool, comprising:
   a converting unit configured to convert portions of first source code of a first one of a plurality of different circuit design languages into an intermediate format common to each of the plurality of different circuit design languages and to convert portions of second source code of a second one of the plurality of different circuit design languages into the intermediate format, the converting unit including a parsing unit to parse similarities of the first source code and the second source code into third source code of the intermediate format common to each of the plurality of different circuit design languages; and
   an executing unit configured to execute the third source code of the intermediate format so as to perform a design simulation of a circuit defined by the circuit design languages; and
   an application program interface (API) configured to enable a user to manipulate processes performed by the converting unit through the API
   wherein the API is configured to determine if a command has been entered by the user and to present the converted circuit design languages to the user, if the command has been entered; and
   wherein the API is configured to provide the converted circuit design languages to the user in an editable form such that the user can edit or change the converted circuit design languages.

2. The logic design development tool of claim 1, wherein the converting unit further includes:
   an elaboration unit configured to search the parsed similarities of the first source code and the second source code to determine if the parsed similarities can be simplified.

3. The logic design development tool of claim 2, wherein the elaboration unit is configured to convert variables of the parsed similarities of the first source code and the second source code into constants.

4. The logic design development tool of claim 1, wherein the converting unit further includes:
   an analysis unit configured to identify combinational and sequential elements of the first source code and the second source code.

5. The logic design development tool of claim 1, wherein the API is configured to save the edited or changed circuit design languages and the converting unit is configured to continue converting the circuit design languages using the saved edited or changed circuit design languages.

6. The logic design development tool of claim 1, where the plurality of different circuit design languages include at least two of Verilog, iHDL, Merlin or System-C.

7. The logic design development tool of claim 1, wherein the portion of the first source code comprises an input portion of the first source code.

8. The logic design development tool of claim 1, wherein the portion of the first source code comprises an output portion of the first source code.

9. A logic design development method, comprising:
   converting code of a first one of a plurality of different circuit design languages into a common intermediate format and converting code of a second one of the plurality of different circuit design languages into the common intermediate format, the common intermediate format being shared by each of the first and second ones of the plurality of different circuit design languages, the converting including parsing similarities of the first and second ones of the plurality of different circuit design languages into the intermediate format, the first one of the plurality of different circuit design languages being different than the second one of the plurality of different circuit design languages;
   executing code of the common intermediate format so as to perform a design simulation of a circuit defined by the first and second circuit design languages;
   providing, via an API, the converted circuit design languages to a user in an editable form such that the user can edit or change the converted circuit design languages in the common intermediate format
   determining if a command has been entered by the user and if the command has been entered, presenting the converted circuit design languages to the user via the API; and
   saving the edited or changed circuit design languages and continue converting the circuit design languages using the saved edited or changed circuit design languages.

10. The method of claim 9, wherein converting the plurality of different circuit design languages includes:
    searching the parsed similarities of the first and second ones of the plurality of different circuit design languages to determine if the parsed similarities can be simplified.

11. The method of claim 10, wherein searching the parsed similarities comprises:
    converting variables of the parsed similarities of the first and second ones of the plurality of different circuit design languages into constants.

12. The method of claim 9, wherein converting the plurality of different circuit design languages comprises:
    identifying combinational and sequential elements of the first and second ones of the plurality of circuit design languages.

13. The method of claim 9, further comprising:
enabling a user to manipulate the conversion of the first and second ones of the plurality of different circuit design languages through an Application Program Interface (API).

14. The logic design development tool of claim 9, where the plurality of different circuit design languages include at least two of Verilog, iHDL, Merlin or System-C.

15. A computer program product configured to execute computer implemented instructions, comprising:
a first computer code configured to convert portions of first source code of a first one of a plurality of different circuit design languages into an intermediate format that is common to each of the plurality of different circuit design languages and to convert portions of second source code of a second one of the plurality of different circuit design languages into the intermediate format, the first one of the plurality of different circuit design languages being one of Verilog, iHDL, Merlin or System-C and the second one of the plurality of different circuit design languages being another one of Verilog, iHDL, Merlin or System-C, the first computer code including code to parse similarities of the first source code and the second source code into third source code of the intermediate format that is common to each of the plurality of different circuit design languages;
a second computer code configured to execute the third source code of the intermediate format so as to perform a design simulation of a circuit defined by the circuit design languages; and
a third computer code configured to provide an interface such that a user can manipulate the converted circuit design languages in the intermediate format through the interface
wherein the third computer code is configured to determine if a command has been entered by the user and if the command has been entered, the third computer code is configured to present the converted circuit design languages to the user in an editable form such that the user can edit or change the converted circuit design languages, and the third computer code is configured to save the edited or changed circuit design languages and the first computer code is configured to continue converting the circuit design languages using the saved edited or changed circuit design languages.

16. The computer program product of claim 15, wherein the first computer code comprises code configured to search the parsed similarities of the first source code and the second source code to determine if the parsed similarities can be simplified.

17. The computer program product of claim 15, wherein the portion of the first source code comprises an input portion of the first source code.

18. The computer program product of claim 15, wherein the portion of the first source code comprises an output portion of the first source code.

19. A system comprising:
a storage device configured to store code to convert code of a first one of a plurality of different circuit design languages into a common intermediate format and to convert code of a second one of the plurality of different circuit design languages, the common intermediate format being shared by each of the plurality of different circuit design languages, the first one of the plurality of different circuit design languages being one of Verilog, iHDL, Merlin or System-C and the second one of the plurality of different circuit design languages being another one of Verilog, iHDL, Merlin or System-C, and the stored code to execute code of the common intermediate format so as to perform a design simulation of a circuit defined by the first and second ones of the plurality of circuit design languages, and the code is configured to parse similarities of the first and second ones of the plurality of different circuit design languages into the intermediate format, and to search the parsed similarities to determine if the parsed similarities can be simplified;
a processor configured to execute the code; and
a display device configured to display information relating to the code, and the display device is configured to display an interface to enable a user to manipulate the converted circuit design languages executed by the processor
wherein the code is configured to determine if a command has been entered by the user and if the command has been entered, the display is configured to present the converted circuit design languages to the user in an editable form such that the user can edit or change the converted circuit design languages, and the code is configured to save the edited or changed circuit design languages and the code is configured to continue converting the circuit design languages using the saved edited or changed circuit design languages.

* * * * *